United States Patent
Siemieniec et al.

(10) Patent No.: US 10,593,668 B2
(45) Date of Patent: Mar. 17, 2020

(54) SEMICONDUCTOR DEVICE AND CORRESPONDING MANUFACTURING METHOD

(71) Applicant: Infineon Technologies AG, Neubiberg (DE)

(72) Inventors: Ralf Siemieniec, Villach (AT); Mihai Draghici, Villach (AT); Jens Peter Konrath, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/861,113

(22) Filed: Jan. 3, 2018

(65) Prior Publication Data

US 2018/0190651 A1  Jul. 5, 2018

(30) Foreign Application Priority Data

Jan. 4, 2017  (DE) .................. 10 2017 100 109

(51) Int. Cl.

| H01L 27/07 | (2006.01) |
| H01L 29/80 | (2006.01) |
| H01L 29/868 | (2006.01) |
| H01L 29/40 | (2006.01) |
| H01L 29/66 | (2006.01) |

(Continued)

(52) U.S. Cl.
CPC ...... *H01L 27/0727* (2013.01); *H01L 29/0619* (2013.01); *H01L 29/1608* (2013.01); *H01L 29/36* (2013.01); *H01L 29/401* (2013.01); *H01L 29/45* (2013.01); *H01L 29/6606* (2013.01); *H01L 29/66068* (2013.01); *H01L 29/806* (2013.01); *H01L 29/8083* (2013.01); *H01L 29/868* (2013.01); *H01L 29/872* (2013.01); *H01L 29/47* (2013.01)

(58) Field of Classification Search
None
See application file for complete search history.

(56) References Cited

U.S. PATENT DOCUMENTS

| 6,096,629 A | 8/2000 | Tsai et al. |
| 2003/0127320 A1 | 7/2003 | Emesh et al. |

(Continued)

FOREIGN PATENT DOCUMENTS

| DE | 102009047808 A1 | 5/2011 |
| DE | 102015101966 A1 | 8/2016 |

(Continued)

*Primary Examiner* — Whitney Moore
(74) *Attorney, Agent, or Firm* — Murphy, Bilak & Homiller, PLLC (57) ABSTRACT

A semiconductor device includes a semiconductor body having a first silicon carbide region and a second silicon carbide region which forms a pn-junction with the first silicon carbide region, a first metallization on a front side of the semiconductor body, a contact region that forms an Ohmic contact with the second silicon carbide region, and a barrier-layer between the first metallization and the contact region and that is in Ohmic connection with the first metallization and the contact region. The barrier-layer forms a Schottky-junction with the first silicon carbide region, and includes molybdenum nitride or tantalum nitride. Additional semiconductor device embodiments and corresponding methods of manufacture are described.

18 Claims, 4 Drawing Sheets

(51) Int. Cl.
 *H01L 29/808* (2006.01)
 *H01L 29/45* (2006.01)
 *H01L 29/16* (2006.01)
 *H01L 29/872* (2006.01)
 *H01L 29/36* (2006.01)
 *H01L 29/06* (2006.01)
 *H01L 29/47* (2006.01)

(56) References Cited

U.S. PATENT DOCUMENTS

| | | | | |
|---|---|---|---|---|
| 2005/0051821 | A1* | 3/2005 | Miki | H01L 28/60 |
| | | | | 257/295 |
| 2009/0224354 | A1 | 9/2009 | Konstantinov et al. | |
| 2013/0313570 | A1* | 11/2013 | Sdrulla | H01L 29/7806 |
| | | | | 257/77 |
| 2015/0255362 | A1* | 9/2015 | Konrath | H01L 21/02126 |
| | | | | 257/272 |
| 2016/0276452 | A1 | 9/2016 | Kortratti et al. | |
| 2018/0122933 | A1* | 5/2018 | Matocha | H01L 27/0629 |

FOREIGN PATENT DOCUMENTS

| | | |
|---|---|---|
| JP | 2003510817 A | 3/2003 |
| JP | 2006237393 A | 9/2006 |
| JP | 2008172008 A | 7/2008 |
| JP | 2010165838 A | 7/2010 |
| JP | 2012222060 A | 11/2012 |
| JP | 2013042050 A | 2/2013 |
| JP | 2014063948 A | 4/2014 |
| JP | 2015170857 A | 9/2015 |
| WO | 2016185526 A1 | 11/2016 |

* cited by examiner

SEMICONDUCTOR DEVICE AND CORRESPONDING MANUFACTURING METHOD

TECHNICAL FIELD

Embodiments of the present invention relate to semiconductor devices, in particular to power semiconductor transistors having a vertical channel, and to related methods for producing heterojunction semiconductor devices.

BACKGROUND

In power application, high-speed, low-loss diodes are often desired, e.g. as clamp and anti-parallel diodes. Further, these diodes are often desired to block high voltage in the reverse direction, have low resistance in the forward direction (Ron), and/or have a high robustness. The Schottky diode, which is a majority carrier device and avoids any switching delays associated with minority carrier recombination, is a very fast diode. Schottky diodes can also have a low turn-on voltage, but may have an increased leakage current and low breakdown in the reverse direction compared to bipolar (p/n junction) diodes.

To combine the speed of the Schottky diode and the blocking capability of the bipolar diode, the merged PiN Schottky (MPS) diode, also referred to as Junction Barrier Schottky (JBS) diode, was developed. The MPS diode may include a drift layer and alternating Schottky areas and shielding regions forming respective pn-junctions with the drift layer. In forward direction (of the pn-junctions), the MPS diode may function similar to a Schottky diode in that majority carriers are injected across a Schottky-junction (Schottky contacts) formed by a metal-semiconductor interface in the Schottky areas. This may result in low turn-on voltage and fast switching. In the reverse direction (in which the pn-junctions are reversely biased), depletion regions may be formed at the pn-junctions so that the Schottky-junctions are shielded against highest electric fields. Accordingly, high leakage current arising from the Schottky junctions can be significantly reduced.

However, there is a need to further improve turn-on voltage and/or robustness of MPS-diodes without substantially deteriorating other device parameters.

SUMMARY

In an embodiment of a semiconductor device, the semiconductor device comprises a semiconductor body having a first silicon carbide region and a second silicon carbide region, which forms a pn-junction with the first silicon carbide region. The semiconductor device may further include a first metallization arranged on a front side of the semiconductor body and a contact region that forms an Ohmic contact with the second silicon carbide region. The semiconductor device may further include a barrier-layer that is arranged between the first metallization and the contact region and is in Ohmic connection with the first metallization and the contact region. The barrier-layer may form a Schottky-junction with the first silicon carbide region. The barrier-layer may comprise molybdenum nitride.

According to an embodiment of a semiconductor device, the semiconductor device comprises a semiconductor body having a first semiconductor region and two second semiconductor regions each forming a respective pn-junction with the first semiconductor region and a first metallization arranged above a front side of the semiconductor body. The semiconductor device may comprise a metal nitride layer in Ohmic connection with the first metallization and the two second semiconductor regions. The metal nitride layer may be arranged between the first metallization and the semiconductor body and form with the first semiconductor region a Schottky-junction, which is, in a normal projection onto the front side, arranged between the pn-junctions.

According to an embodiment of a method for forming a semiconductor device, the method comprises providing a silicon carbide layer of a first conductivity type having a first side. The method may further comprise forming, in the silicon carbide layer, a first silicon carbide region and a second silicon carbide region, which second silicon carbide region forms a pn-junction with the first silicon carbide region. The method may comprise forming a contact region that forms an Ohmic contact with the second silicon carbide region. The method may comprise forming a barrier-layer on the contact region and the first silicon carbide region, such that a Schottky-junction is formed between the barrier-layer and the first silicon carbide region and such that an Ohmic connection is formed between the barrier-layer and the contact region. The method may comprise forming a first metallization on the barrier-layer, and in Ohmic connection with the barrier-layer. The barrier-layer may comprise molybdenum nitride.

Those skilled in the art will recognize additional features and advantages upon reading the following detailed description, and upon viewing the accompanying drawings.

BRIEF DESCRIPTION OF THE DRAWINGS

The components in the figures are not necessarily to scale, instead emphasis being placed upon illustrating the principles of the invention. Moreover, in the figures, like reference numerals designate corresponding parts. In the drawings.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention.

The following detailed description, therefore, is not to be taken in a limiting sense, and the scope of the present invention is defined by the appended claims.

Reference will now be made in detail to various embodiments, one or more examples of which are illustrated in the figures. Each example is provided by way of explanation, and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appending claims. The drawings are not scaled and are for illustrative purposes only. For clarity, the same elements or manufacturing steps have been designated by the same references in the different drawings if not stated otherwise.

According to an embodiment of a semiconductor device, the semiconductor device includes a semiconductor body having a front side and including, in a vertical cross-section perpendicular to the front side, a first silicon carbide region, and two second silicon carbide regions which are spaced apart from each other by the first silicon carbide region. Each of the two second silicon carbide regions forms a respective pn-junction with the first silicon carbide region. A first metallization comprising copper is arranged on the front side. In the vertical cross-section, the semiconductor device further includes two contact regions and a barrier-layer. Each of the two contact regions forms an Ohmic contact with one of the two second silicon carbide regions. The barrier-layer provides an effective diffusion barrier for copper, is arranged between the first metallization and the two contact regions, in Ohmic connection with the first metallization and the two contact regions, and forms a Schottky-junction with the first silicon carbide region.

According to an embodiment of a semiconductor device, the semiconductor device includes a semiconductor body extending between a front side and a backside opposite the front side, and a first metallization comprising copper, and arranged above the front side. In a vertical cross-section perpendicular to the front side, the semiconductor body includes a first semiconductor region and two second semiconductor regions each of which forms a respective pn-junction with the first semiconductor region. A metal nitride layer in Ohmic connection with the first metallization and the two second semiconductor regions is arranged between the first metallization and the semiconductor body, and forms with the first semiconductor region a Schottky-junction which is, in a normal projection onto the front side, arranged between the pn-junctions.

According to an embodiment of a method for forming a semiconductor device, the method includes providing a silicon carbide layer of a first conductivity type having a first side, forming in the silicon carbide layer two second semiconductor regions of a second conductivity type which are, in a vertical cross-section perpendicular to the first side, spaced apart from each other by a channel portion of the silicon carbide layer, and forming, in the vertical cross-section, two contact regions. The channel portion of the silicon carbide layer may be a first silicon carbide region. A barrier-layer for copper is formed on the two contact regions and the channel portion so that a Schottky-junction is formed between the barrier-layer and the channel portion, and that an Ohmic connection is formed between the barrier-layer and each of the two contact regions. A first metallization comprising copper is formed on and in Ohmic connection with barrier-layer. The method is performed so that each of the two contact regions is arranged on and in Ohmic contact with one of the two second semiconductor regions.

The term "horizontal" as used in this specification intends to describe an orientation substantially parallel to a first or main surface of a semiconductor substrate or body. This can be for instance the surface of a wafer or a die.

The term "vertical" as used in this specification intends to describe an orientation which is substantially arranged perpendicular to the first surface, i.e. parallel to the normal direction of the first surface of the semiconductor substrate or body.

In this specification, a second surface of a semiconductor substrate of semiconductor body is considered to be formed by the lower or backside surface while the first surface is considered to be formed by the upper, front or main surface of the semiconductor substrate. The terms "above" and "below" as used in this specification therefore describe a relative location of a structural feature to another structural feature with consideration of this orientation.

In this specification, n-doped is referred to as first conductivity type while p-doped is referred to as second conductivity type. Alternatively, the semiconductor devices can be formed with opposite doping relations so that the first conductivity type can be p-doped and the second conductivity type can be n-doped. Furthermore, some Figures illustrate relative doping concentrations by indicating "−" or "+" next to the doping type. For example, "n$^-$" means a doping concentration which is less than the doping concentration of an "n"-doping region while an "n*"-doping region has a larger doping concentration than the "n"-doping region. However, indicating the relative doping concentration does not mean that doping regions of the same relative doping concentration have to have the same absolute doping concentration unless otherwise stated. For example, two different n$^+$-doping regions can have different absolute doping concentrations. The same applies, for example, to an n$^+$-doping and a p$^+$-doping region.

Specific embodiments described in this specification pertain to, without being limited thereto, to semiconductor devices such as MPS diodes and normally on JFETs, in particular to vertical power semiconductor devices, and to manufacturing methods therefor.

Typically, the semiconductor device is a power semiconductor device having an active area with a plurality of diode-cells for controlling a load current between two load metallization. Furthermore, the power semiconductor device may have a peripheral area with at least one edge-termination structure at least partially surrounding an active area of transistor-cells when seen from above.

The term "power semiconductor device" as used in this specification intends to describe a semiconductor device on a single chip with high voltage and/or high current switching capabilities. In other words, power semiconductor devices are intended for high current, typically in the Ampere range and/or high voltages, typically above 100 V, more typically above 400 V or even 1000 V.

In the context of the present specification, the term "in Ohmic connection" intends to describe that there is an Ohmic current path, e.g. a low-Ohmic current path, between respective elements or portions of a semiconductor device when no voltages or only small probe voltages are applied to and/or across the semiconductor device. Within this specification the terms "in Ohmic connection", "in resistive electric connection", "electrically coupled", and "in resistive electric connection" are used synonymously. In the context of the present specification, the term "in Ohmic contact"

intends to describe that two elements or portions of a semiconductor device are in direct mechanical (intimate physical) contact and in Ohmic connection.

In the context of the present specification, the term "metallization" intends to describe a region or a layer with metallic or near metallic properties with respect to electric conductivity. A metallization may be in contact with a semiconductor region to form an electrode, a pad and/or a terminal of the semiconductor device. The metallization may be made of and/or comprise a metal such as Al, Ti, W, Cu, Mo and Co, or a metal alloy such as AlCu, but may also be made of a material with metallic or near metallic properties with respect to electric conductivity such as an electrically conductive silicide such as $TaSi_2$, $TiSi_2$, PtSi, $CoSi_2$, $WSi_2$, MoSi or even a highly doped amorphous silicon, e.g. a highly doped polycrystalline silicon. The metallization may also include different electrically conductive materials, for example a stack of those materials.

In the context of the present specification, the terms "Schottky contact" and "Schottky junction" intends to describe a metal-semiconductor junction having rectifying characteristics. Schottky junctions may be formed at a surface of a semiconductor body layer or region from any suitable Schottky contact forming material, in particular a metal nitride such as molybdenum nitride or tantalum nitride for SiC or Si devices, or a Schottky metal including, but not limited to Ta, Co, Mo, Al, Ti, Ni, Cr, Mo, Pt, Pd, Zr, W, alloys thereof, and mixtures thereof.

In the following, embodiments pertaining to semiconductor devices and manufacturing methods for forming semiconductor devices are explained mainly with reference to silicon carbide (SiC) semiconductor devices having a monocrystalline SiC semiconductor body. Accordingly, a semiconductor region or layer is typically a monocrystalline SiC-region or SiC-layer if not stated otherwise.

It should, however, be understood that the semiconductor body can be made of any semiconductor material suitable for manufacturing a semiconductor device. For power semiconductor applications currently mainly Si, SiC and GaN materials are used. If the semiconductor body comprises a high band gap material such as SiC or GaN which has a high breakdown field strength and high critical avalanche field strength, respectively, the doping of the respective semiconductor regions can be chosen higher which reduces the on-state resistance $R_{on}$.

Figure 1A:
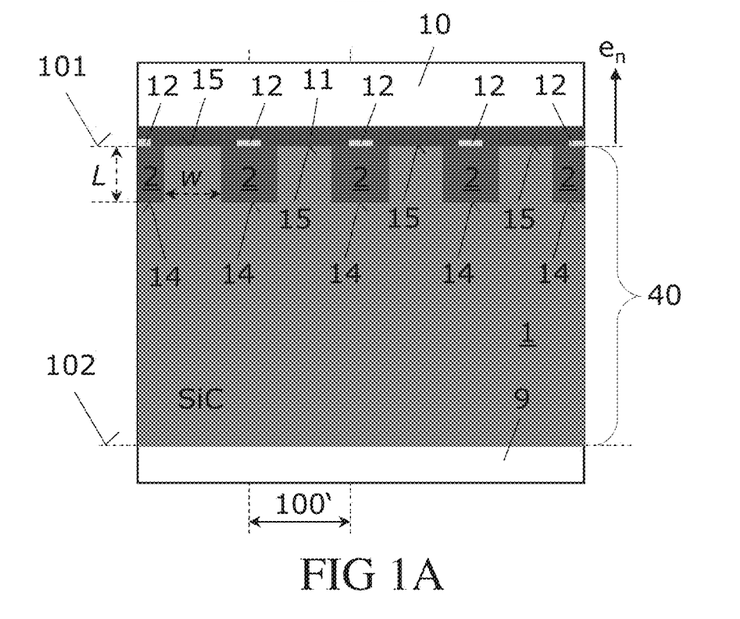
FIG. 1A illustrates a cross-section through a semiconductor device according to an embodiment.
Figure 1B:
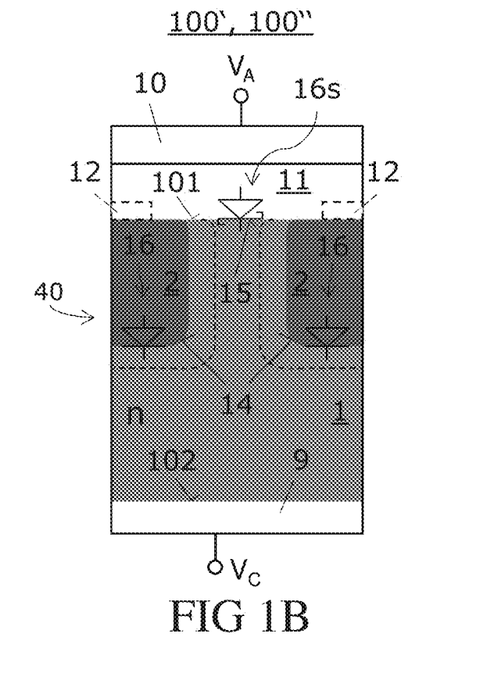
FIG. 1B illustrates a cross-section through a semiconductor device according to an embodiment.
Figure 1C:
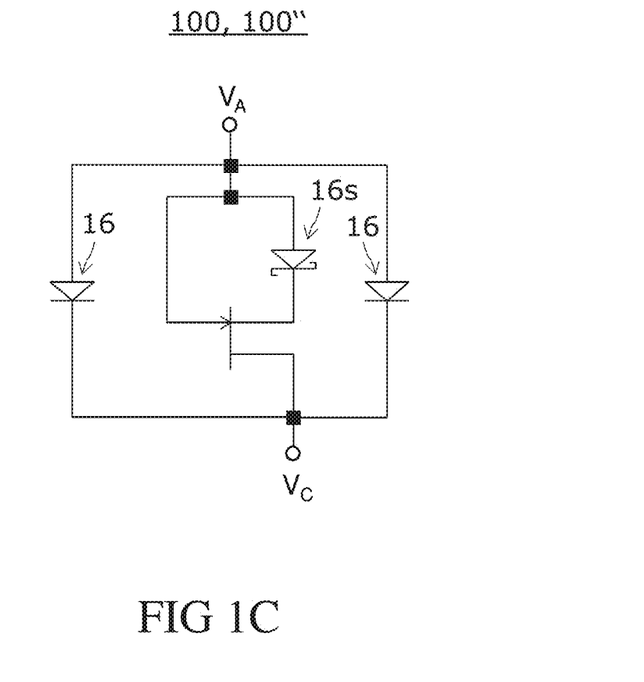
FIG. 1C illustrates an equivalent circuit diagram of the semiconductor device illustrated in FIG. 1B according to an embodiment.

With reference to FIGS. 1A through 1C, embodiments of a semiconductor device 100 are explained. FIGS. 1A through 1C illustrate respective schematic cross-sections through a silicon carbide (SiC) semiconductor body 40 of the semiconductor device 100. The semiconductor body 40 includes a front side 101 defining a vertical direction $e_n$, and a back side 102 opposite the front side 101. The front side 101 and the back side 102 are typically substantially parallel to each other and/or implemented as substantially flat surfaces of the semiconductor body 40.

According to an embodiment, the semiconductor device 100 is a two terminal semiconductor device with a first metallization 10 arranged on the front side 101 and a second metallization 9 arranged on the back side 102. In the following, the first metallization 10 and the second metallization 9 are also referred to as front metallization 10 and back metallization 9, respectively.

The second metallization 9 is typically in Ohmic connection with a first silicon carbide region or layer 1 that may also form a drift layer for a current between the two metallizations 9, 10.

In other embodiments (not shown in the figures), a further metallization may be arranged on the front side 101 and spaced apart from the first metallization 10, for example in another vertical cross-section or left or right of the illustrated section.

In the vertical cross-section shown in FIG. 1A, a plurality of second silicon carbide regions 2 are formed next to the first side 101, typically at the first side 101. The first side 101 may be a front side 101 of the semiconductor body 40. The second SiC regions 2 are spaced apart from each other by the first SiC region 1 and respective upper portions of the first SiC region 1 typically forming channel regions, respectively. Each of the typically well-shaped second SiC regions 2 forms a respective pn-junction 14 with the first SiC region 1. The pn-junctions 14 may extend at least close to the first side 101.

When seen from above and in a normal projection onto the first side 101 or a plane substantially parallel to the first side 101, respectively, the second SiC regions 2 may form an array, typically a regular array, for example a 1-dimensional array of stripes or a 2-dimensional array (checkerboard like arrangement of circles or polygons).

The semiconductor device 100 is typically a power semiconductor device that includes more than 10 or even 100 substantially identical cells 100'.

In the exemplary embodiment, one contact region 12 is arranged on (and at) each of the second SiC regions 2, forms an Ohmic contact with a respective one of the second SiC region 2, and is in Ohmic connection with a first metallization 10 that comprises copper (Cu). In the following, first metallization 10 is also referred to as copper comprising metallization 10.

The contact regions 12 may be arranged at the first side 101.

The second SiC regions 2 are typically highly p-doped to ensure the desired bipolar mode at high forward currents and a high robustness of the device 100 both during avalanche mode and in case of a short-circuit.

For example the doping concentration of the second SiC regions 2 may be higher than $1*10^{18}$ cm$^{-3}$, more typically higher than $5*10^{18}$ cm$^{-3}$, even more typically higher than $1*10^{19}$ cm$^{-3}$.

A distance w between adjacent second silicon carbide regions 2 is typically at most two times, more typically at most 1.5 times the vertical extension L of the second silicon carbide regions 2.

Accordingly, a (reverse) pinch-off voltage may be lower, for example by a factor of at least 2, typically of at least about 4 or even 10 than the breakdown voltage of the Schottky-junction(s) 15 and, thus, a particularly low leakage in blocking mode may be achieved.

The pinch-off voltage is typically in a range from about a few Volts to about a few 10 Volts, more typically in a range from about 5V to about 100 V.

Further, non-presented numerical simulations reveal that the breakdown region may be pinned at or at least close to the bottom region of the second silicon carbide regions 2.

The first metallization 10 may be made of copper, a copper alloy, in particular an alloy comprising Cu and aluminum (Al), e.g. a CuAl alloy. The first metallization 10 may also include (different) layers of those materials.

Due to its particularly high electric conductivity, using a copper comprising metallization 10 may result in very low contact resistance, in particular for SiC devices. Thus, very low overall Ohmic losses may be achieved. Further, the risk of any drift of device properties during operation is low since the diffusivity of Cu is very low in SiC at expected temperatures during rated device operations.

The Ohmic connection between the first metallization 10 and the second SiC regions 2 is desired to be as low as possible to ensure a particularly high device robustness during avalanche and a short-circuit.

For this reason, the contact regions 12 are typically made of a metal such as titanium (Ti), nickel (Ni), tantalum (Ta), and molybdenum (Mo), a silicide (e.g. CoSi or TiSiCo) or an alloy, in particular an alloy comprising aluminum such as CoAl, more typically an alloy comprising nickel and aluminum such as NiAl, NiTiAl.

According to an embodiment, a barrier-layer 11 providing an effective diffusion barrier for copper is arranged between the first metallization 10 and the contact regions 12, and in Ohmic connection, typically in Ohmic contact with the first metallization 10 and the contact regions 12.

This means in particular that the barrier-layer 11 provides an effective diffusion barrier for copper during an expected life-time and under expected (normal) operation conditions of the semiconductor device 100.

Due to the barrier-layer 11, any substantial migration of copper from the first metallization 10 into the contact regions 12 during expected life-time may be avoided. In a similar device but without the barrier-layer, migration of copper into the contact regions is likely to deteriorate the contact properties between the contact regions 12 and the second SiC regions 2, and thus may lead to decreased device robustness. This is of particular importance for particularly well suited contact regions 12 of Ti, NiAl or NiTAl.

The barrier-layer 11 is typically a metal nitride layer, more typically a molybdenum nitride layer and/or a tantalum nitride layer providing excellent protection against copper migration. The barrier-layer 11 may also include several metal nitride layers.

Typically, the barrier-layer 11 has, depending on composition of the barrier-layer 11 and/or the voltage class of the semiconductor device 100, a (vertical) thickness in a range of 50 nm to 500 nm, more typically in a range of 100 nm to 400 nm.

As illustrated in FIG. 1A, the barrier-layer 11 is typically also arranged at the first SiC region 1d and forms Schottky-junctions 15 with the first SiC region 1 at the first side 101.

By using molybdenum nitride or tantalum nitride as combined copper-barrier layer and Schottky-contact layer between the first metallization 10 and the semiconductor body 40 as well as the contact regions 12, both copper induced degradation of the contact to the second silicon carbide regions 2 may be avoided and a particularly low turn-on voltage of the Schottky-junctions 15, and thus of the semiconductor device 100 may be achieved.

The barrier-layer 11 may, at least in an active or cell area surrounded by a peripheral area with one or more edge-termination structures, substantially cover the first side 101.

In the illustrated cross-section, the Schottky-junctions 15 alternate with the pn-junctions 14. Accordingly, the semiconductor device 100 may be operated as a merged PiN Schottky JFET (MPSJ).

This is explained in more detail with regard to FIGS. 1B and 1C.

FIG. 1B illustrates a vertical cross-section through a semiconductor device 100". The semiconductor device 100" is similar to the semiconductor device 100. FIG. 1B may even correspond to a unit cell 100' of the semiconductor device 100.

However, the contact regions 12 may be only optional as indicated by the two dashed rectangles. Even without the contact regions 12, the semiconductor device 100" may be operated as a comparatively robust MPSJ. However, the contact resistance is typically higher without the contact regions 12. This may limit the robustness of the device.

FIG. 1C illustrates an equivalent circuit diagram of the semiconductor device 100, 100" shown in FIGS. 1A, 1B. Accordingly, the semiconductor device 100" may also be considered as normally-on JFET with the second semiconductor regions 2 as gate regions and an Ohmic contact at the anode side 101, more precisely as a merged parallel connection of a (vertical) bipolar (PiN) diode and a (vertical) normally-on JFET. This structure is in the following also referred to as vertical merged PiN Schottky JFET (VMPSJ).

In the exemplary embodiment, the semiconductor body 40 has a first semiconductor region 1, typically a first SiC region 1, and two second semiconductor regions 2, typically two second SiC regions 2. Each of the second semiconductor regions 2 forms a respective pn-junction 14 with the first semiconductor region 1. A copper comprising first metallization 10 is arranged above, i.e. on and spaced apart from the front side 101. A second metallization 9 is arranged on and in Ohmic connection with, e.g. in Ohmic contact with the first semiconductor region 1.

Accordingly, two pn-diodes 16 are formed in the semiconductor body 40 and arranged between the first metallization 10 typically forming an anode metallization 10 and the second metallization 9 typically forming a cathode metallization 9 of the MPSJ structure 100".

A metal nitride layer 11 in Ohmic connection with the first metallization 10 and the two second semiconductor regions 2 is arranged between the first metallization 10 and the semiconductor body 40, and forms with the first semiconductor region 1 a Schottky-junction 15 which is, in a normal projection onto the first side 101, arranged between the two pn-junctions 14.

As explained above, the metal nitride layer 11 may both provide an effective diffusion barrier for copper and a Schottky layer on SiC resulting in low turn-on voltage (lower than e.g. for Ti/SiC-contacts).

Accordingly, a Schottky diode 16s is arranged between the two metallizations 9, 10. Thus, the Schottky diode(s) 16s and the pn-diodes 16 are connected in parallel between the metallizations 9, 10.

Due to the Schottky diode 16s, a low turn-on voltage in forward direction of the pn-junctions 16, in particular when molybdenum nitride or tantalum nitride is used, and fast switching may be achieved. In the typical embodiment of an n-type first semiconductor region 1, the voltage difference $V_A - V_C$ between the metallizations 10, 9 is positive in forward direction.

In forward direction and below a critical current (density), the semiconductor device 100, 100" is in a unipolar normal forward mode with a linear current-voltage characteristic (above the turn-on voltage of the Schottky diode(s) 16. If the product of forward current times voltage drop in the channel region(s) becomes higher than the threshold voltage of the pn-junction(s) 14, the semiconductor device 100, 100" switches in a bipolar high current forward mode (having a nonlinear (exponential) current-voltage characteristic).

During a blocking mode ($V_A < V_C$), in which the rectifying pn-junctions 16 are reverse biased (reverse biasing of the Schottky diode(s) 16s and the pn-diodes 16), space charge regions (or depletion regions) indicated by the dashed curves in FIG. 1B are formed which extend from respective second semiconductor regions 2 into the first semiconductor region 1 and may even merge with each other. Accordingly, high electric fields are avoided close to the Schottky-junction 15 during the blocking mode by the implementation of the second semiconductor regions 2 as combined anode and shielding regions. Accordingly, the leakage current may be reduced without substantially altering the unipolar behavior of the semiconductor device 100" in normal forward mode compared to semiconductor devices without the second semiconductor regions 2. Note that the leakage current mainly depends on the electric field strength at the Schottky-junction 15.

In other words, current paths (connecting paths) running through the semiconductor body 40 and between the first metallization 19 (first side 101) and the second metallization 9 without crossing any pn-junction may be pinched off in the blocking mode.

In the blocking mode ($V_A < V_C$), a closed space-charge region is formed in the first silicon carbide region 1 (and between adjacent second semiconductor regions 2) at a pinch-off voltage $V_{POff}$ having an absolute value $|V_{POff}|$ lower than an absolute value $|V_{BS}|$ of a breakdown voltage $V_{BS}$ of the Schottky-structure 15, 16s.

As illustrated in FIG. 1A and FIG. 1B, the second semiconductor regions 2 may be substantially shaped as rectangles in the vertical cross-section.

Alternatively, the second semiconductor regions 2 may be substantially shaped as isosceles in the vertical cross-section. Accordingly, a narrowing of the controllable (n-type) current path is formed between adjacent second semiconductor regions 2. This may facilitate reducing of the leakage current during the blocking mode.

The (average) distance between adjacent second semiconductor regions 2 is typically in a range from about 0.4 μm to about 2.0 μm, more typically in a range from about 0.8 μm to about 1.4 μm The vertical extension of the second semiconductor regions 2 is typically in a range from about 0.4 μm to about 2.0 μm, more typically in a range from about 0.8 μm to about 1.4 μm Accordingly, any drain-induced barrier lowering (DIBL) may at least substantially be avoided.

Figure 2A:
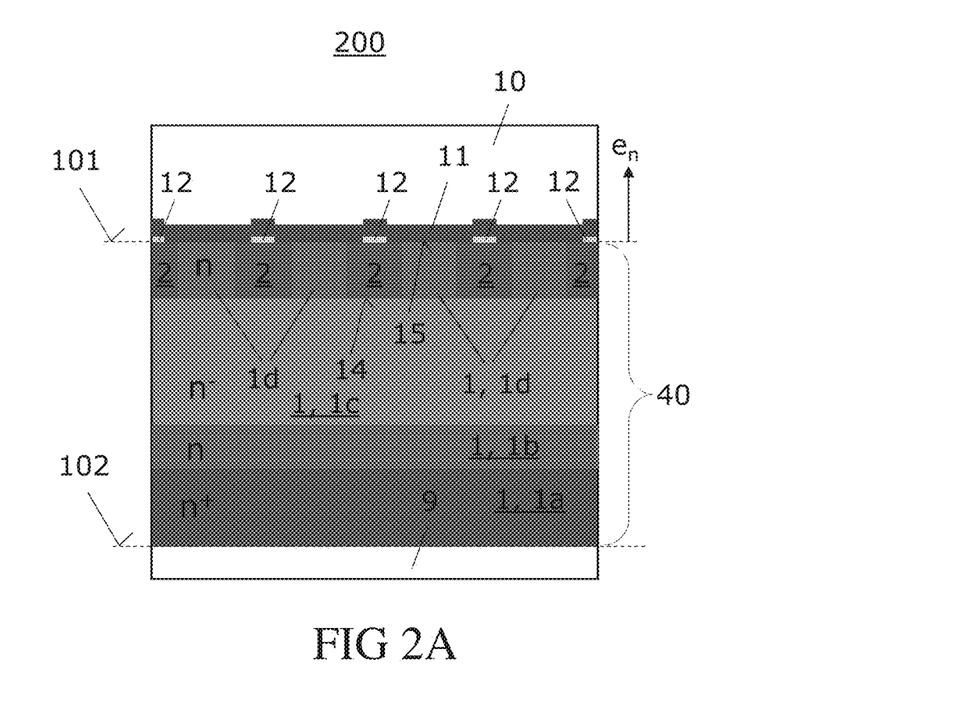
FIG. 2A illustrates a cross-section through a semiconductor device according to an embodiment.

FIG. 2A illustrates a vertical cross-section through a semiconductor device 200. The semiconductor device 200 is similar to the semiconductor device 100 illustrated above with regard to FIG. 1A and may also be operated as a diode. However, the semiconductor device 100 includes several n-doped layers 1a, 1, b, 1d, 1c, 1d and regions, respectively, which are in Ohmic connection with each other.

In the exemplary embodiment, the semiconductor body 40 includes an n-type SiC contact layer 1a in Ohmic contact with the second metallization 9, a first SiC layer (region) 1d at the first side 101, and several second SiC regions 2 which are spaced apart from each other by upper portions 1d of the first SiC region 1d. The upper portions 1d typically form channel regions of the semiconductor device 200.

As illustrated in FIG. 2A, the alternating portions 1d and second regions 2 may extends from the first side 101 to substantially the same vertical depth and/or have substantially the same vertical extension.

Further, the upper portions 1d and the second SiC regions 2 may extend to an n-type SiC drift layer 1c arranged underneath and having a higher doping concentration than the upper portions 1d and the first SiC layer 1d, respectively.

Even further, an n-type SiC buffer layer 1b may be arranged between the SiC contact layer 1a and the SiC drift layer 1c. The doping concentration of the buffer layer 1b may be higher than the doping concentration of the drift layer 1c and/or lower than the doping concentration of the contact layer 1a.

Figure 2B:
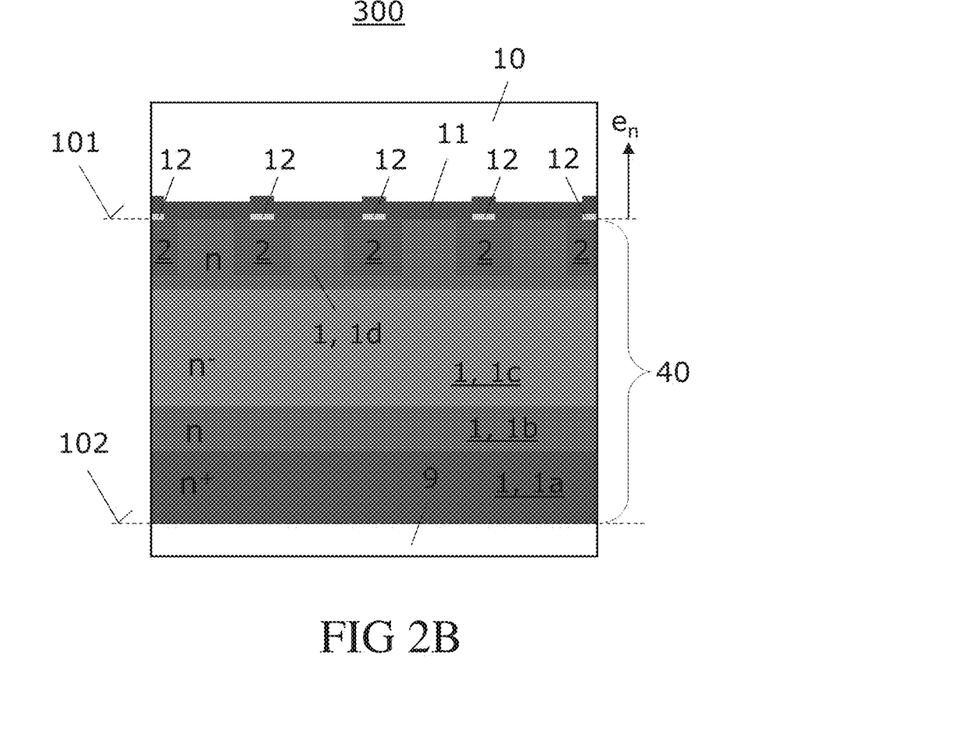
FIG. 2B illustrates a cross-section through a semiconductor device according to an embodiment.

FIG. 2B illustrates a cross-section through a semiconductor device 300. The semiconductor device 300 is similar to the semiconductor device 200 illustrated above with regard to FIG. 2A and may also be operated as a diode.

However, the second SiC regions 2 have a lower vertical extension than the first SiC layer 1d. Further, the second SiC regions 2 are embedded in the first SiC layer 1d. Thus, a lowermost sub-layer of the first SiC layer 1d may form a current spread layer. Accordingly, a particularly low Ron may be achieved.

Alternatively, an n-type current spread layer e.g. having a higher doping concentration than the first SiC layer 1d may be arranged between the first SiC layer 1d and the drift layer 1c. The current spread layer may also have a doping concentration that is higher compared to the drift layer 1c and lower compared to the first SiC layer 1d (channel regions).

Further, the doping concentration of the channel regions 1d may vary as function of the distance from the first side 101. This may facilitate reducing of the leakage current during the blocking mode. For example, the doping concentration of the channel regions 1d may have a local maximum close to a depth that corresponds to about half the vertical extension L of the second silicon carbide regions 2.

The semiconductor devices explained above with regard to FIG. 1A to FIG. 2B may e.g. be used as free-wheeling diodes in power supplies and bridge circuits, in particular in an H bridge and a half-bridge.

In the following, methods for manufacturing the above explained devices are explained.

FIGS. 3A to 3F and 4A to 4D illustrate vertical cross-sections through a semiconductor body 40 during method steps of a method according to embodiments. The method is typically performed on wafer level.

Figure 3A:
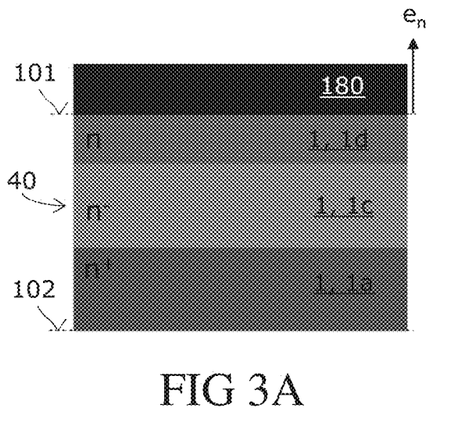
FIGS. 3A to 3F and 4A to 4D illustrate vertical cross-sections through a semiconductor body during method steps of a method according to embodiments.

In a first process, an n-type semiconductor layer 1d, typically an n-type silicon carbide layer 1d having a first side 101 may be provided.

Thereafter, a hard mask layer 180. e.g. a tetraethylorthosilicate (TEOS) layer, may be formed on the first side 101. The resulting structure is shown in FIG. 3A. The SiC layer 1d may be an uppermost layer of a SiC-wafer 40.

In the exemplary embodiment, the uppermost SiC layer 1d is arranged on an n-type drift layer 1a arranged on a highly n-doped contact layer 1a extending to a back-side of the wafer 40.

Thereafter, the hard mask layer 180 may be structured.

Figure 3B:
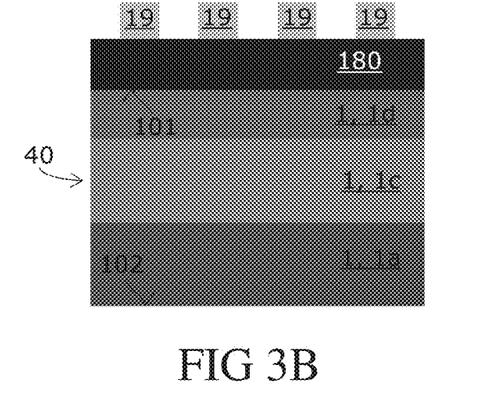
Figure 3C:
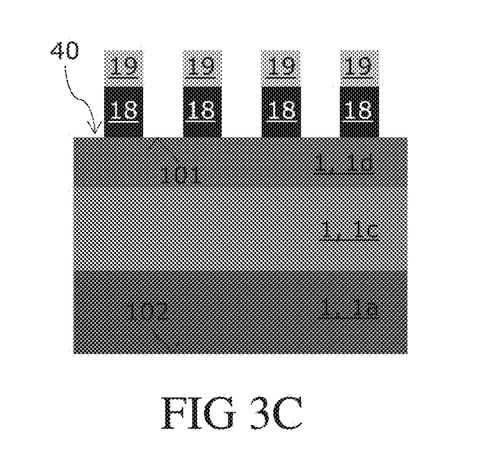

As illustrated in FIG. 3B and FIG. 3C structuring the hard mask layer 18 may be achieved by forming a resist mask 19 on the hard mask layer 180 and subsequent etching so that the uppermost SiC layer 1d is partly exposed at mask openings.

Figure 3D:
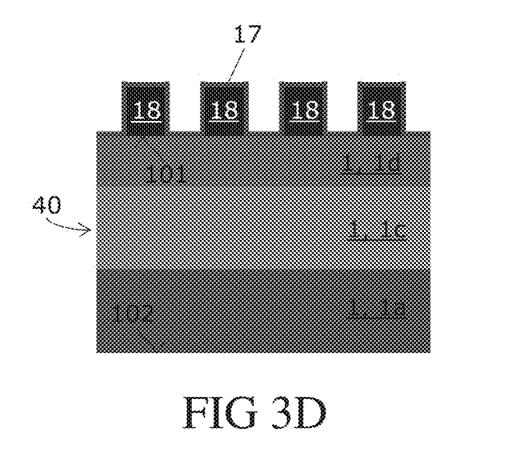

After removing the resist mask 19, a conformal stray layer 17 may be formed on the mask 18. The stray layer 17 may be made of silicon oxide, silicon nitride etc. The resulting structure is shown in FIG. 3D Thereafter, p-type dopants may be implanted into the wafer and the silicon carbide layer 1, respectively, from the first side 101.

Figure 3E:
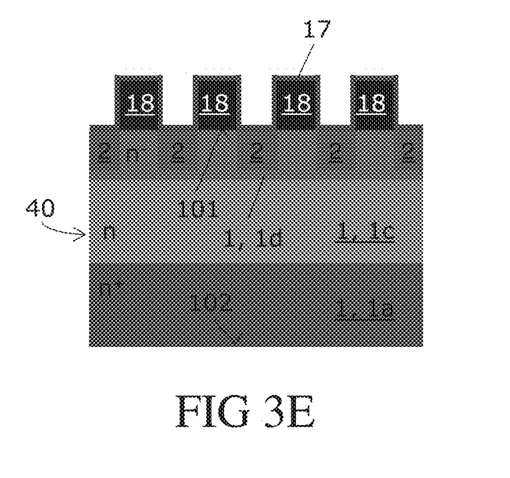

After a later (e.g. a subsequent) thermal annealing to activate the implanted p-dopants, spaced apart p-type second semiconductor regions 2 may be formed next to the first side 101 as shown in FIG. 3E.

Figure 3F:
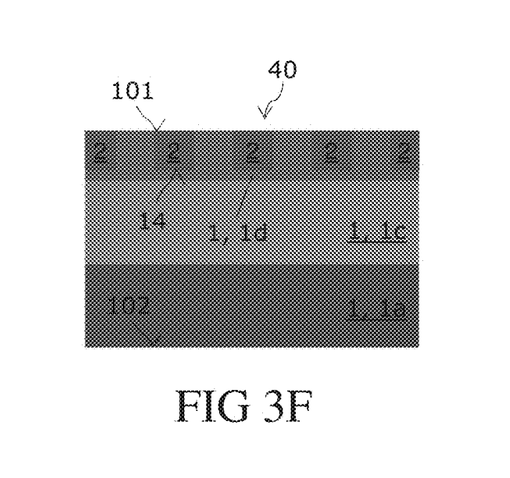

Thereafter, the mask 18 and the stray layer may be removed. The resulting structure is shown in FIG. 3F.

Thereafter, respective contact regions 12 may be formed on and at each of the second semiconductor regions 2.

To achieve a particularly good and reliable contact, the silicon carbide layer 1d may be etched at the first side 101 prior to forming the contact regions 12.

Alternatively, a sacrificial oxide layer may be formed at the first side 101 and removed by etching prior to forming the contact regions 12.

Forming the contact regions 12 may include forming a silicide region at each of the second semiconductor regions 2.

Alternatively, a contact layer 120 may be formed on the first side 101. Thereafter, the contact layer 120 may be structured by dry etching or using a lift-off process. The latter is explained with regard to FIGS. 4A and 4B.

Figure 4A:
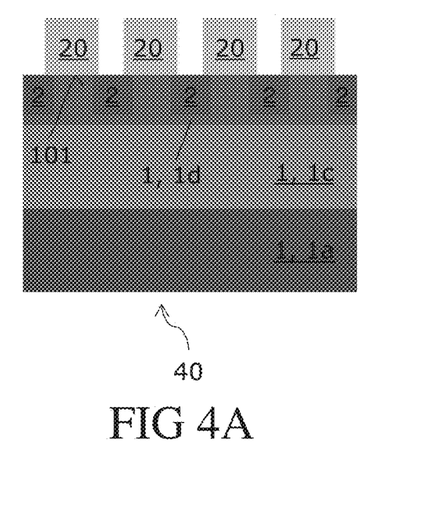

As illustrated in FIG. 4A, a further resist mask 20 at least substantially covering the first side 101 except for (typically central) portions of the second semiconductor regions 2.

Thereafter, Ni and Al may be deposited on the first side 101 to form a NiAl-contact layer 120.

Alternatively, any other suitable material, in particular Ti may be deposited on the first side 101.

Figure 4B:
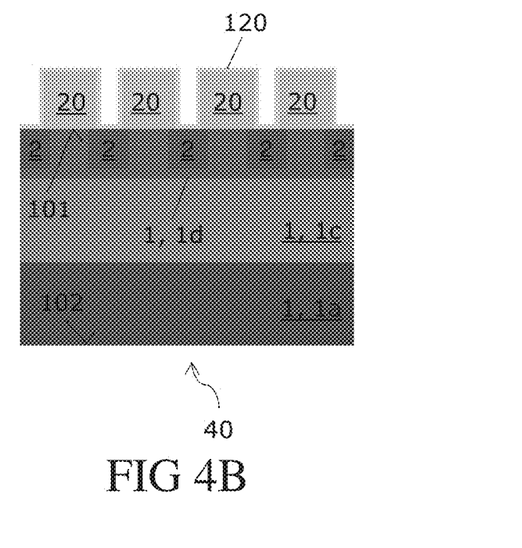

As shown in FIG. 4B, the contact layer 120 may be a conformal layer.

After a subsequent lift-off process, remaining portions of the contact layer 120 form the contact regions 12. Forming of the contact regions 12 may include a thermal treatment.

Figure 4C:
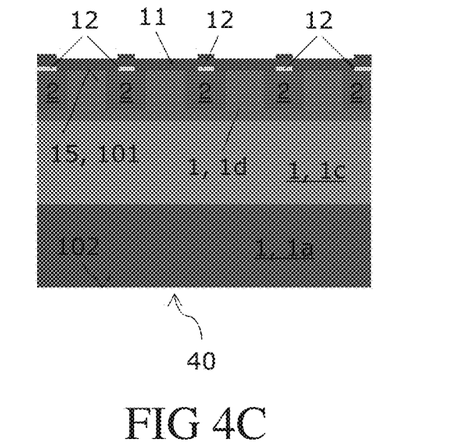

Thereafter, a barrier-layer 11 for copper may be formed on the contact regions 12 and channel portions 1d between adjacent second semiconductor regions 2 so that Schottky-junctions 15 are formed between the barrier-layer 11 and the channel portion 1d and that an Ohmic connection is formed between the barrier-layer 11 and each of the contact regions 12. The resulting structure is illustrated in FIG. 4C.

Forming the barrier-layer 11 may be achieved by depositing a metal nitride, in particular molybdenum nitride or depositing tantalum nitride which both allow for particularly low turn-on voltages.

Alternatively, tantalum or molybdenum may be deposited on the first side 101 to form a metal layer, and nitrogen may be implanted into the metal layer.

Thereafter, a copper comprising front metallization 10 may be formed on and in Ohmic contact with the barrier-layer 11.

Forming the front metallization 10 may include depositing copper, depositing aluminum and/or CuAl.

In addition, next to the first side 101, an edge-termination structure surrounding the second semiconductor regions in a projection onto the first side 101 may be formed. Accordingly, the field intensity around a termination region of the rectifying junction pn-junction in the blocking mode may be lowered by spreading the electric field lines across the termination region.

Figure 4D:
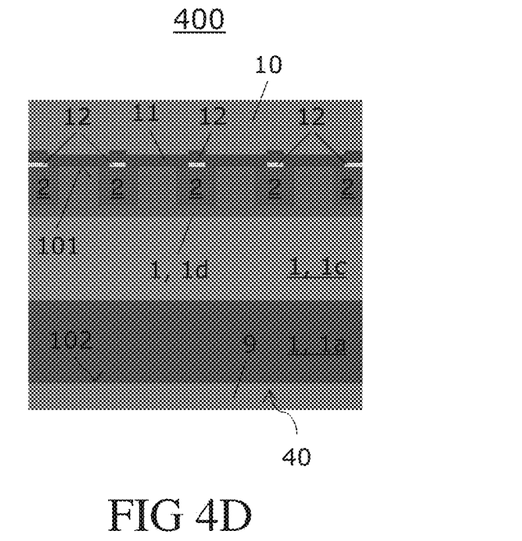

Thereafter, a back metallization 9 may be formed opposite the front metallization 10 and in Ohmic contact with the contact layer a.

Thereafter the wafer may be singulated. The resulting exemplary semiconductor device 400 is illustrated in FIG. 4D.

The manufacturing is comparatively robustness against process tolerances. Due to the formed alternating Schottky- and JFET-structures, comparatively large variation in the pinch-off voltage of the JFET-structures due to manufacturing variations (e.g. CD variations) may be tolerable as the Schottky-structures may be designed to block reverse voltage up to the largest expected pinch-off voltage. This may facilitate manufacturing.

Further, etching of trenches may be completely avoided during manufacturing. This may also facilitate manufacturing.

The manufactured semiconductor device 400 is typically also a MPSJ having channel regions that are pinched off in blocking mode above a pinch-off voltage as explained above with regard to FIG. 1A to FIG. 2B. Any drain-induced barrier lowering (DIBL) may at least substantially be avoided as the channel regions may remain pinched off below the breakdown voltage. Accordingly, the leakage current may be extremely low and/or substantially independent of the reverse voltage (between pinch-off voltage and breakdown voltage).

Different to the vertical merged PiN Schottky JFETs described herein, the pn-diodes of known MPS diodes do not completely pinch off the channel regions at rated breakdown voltage and/or the DIBL of the equivalent JFET-structure is in the order of the breakdown voltage, i.e. the voltage at which the reverse-biased pn diode breaks down and significant current starts to flow due to an avalanche multiplication process Although various exemplary embodiments of the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. It should be mentioned that features explained with reference to a specific figure may be combined with features of other figures, even in those cases in which this has not explicitly been mentioned. Such modifications to the inventive concept are intended to be covered by the appended claims.

Spatially relative terms such as "under", "below", "lower", "over", "upper" and the like are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A semiconductor device, comprising:
a semiconductor body having a first silicon carbide region and a second silicon carbide region which forms a pn-junction with the first silicon carbide region;
a first metallization on a front side of the semiconductor body;
a contact region that forms an Ohmic contact with the second silicon carbide region; and a barrier-layer arranged between the first metallization and the contact region and that is in Ohmic connection with the first metallization and the contact region, wherein the barrier-layer forms a Schottky junction with the first silicon carbide region, wherein the barrier-layer comprises molybdenum nitride, wherein the semiconductor device comprises at least two second silicon carbide regions, wherein a distance between adjacent ones of the at least two second silicon carbide regions is at most two times an extension of at least one of the at least two second silicon carbide regions in a vertical direction perpendicular to the front side, wherein the semiconductor device further comprises:
 a second metallization opposite the first metallization and in Ohmic connection with the first silicon carbide region; and
 a closed space-charge region that forms in the first silicon carbide region between adjacent ones of the at least two second silicon carbide regions when a reverse voltage difference having a lower absolute value than a breakdown voltage of the Schottky junction is applied between the first metallization and the second metallization.

2. The semiconductor device of claim 1, wherein the barrier-layer has, in a vertical direction perpendicular to the front side, a thickness in a range from 50 nm to 500 nm.

3. The semiconductor device of claim 1, wherein the first metallization comprises at least one of copper and aluminum.

4. The semiconductor device of claim 1, wherein the contact region comprises a metal, a silicide or an alloy.

5. The semiconductor device of claim 4, wherein the contact region comprises titanium.

6. The semiconductor device of claim 4, wherein the contact region comprises nickel and aluminum.

7. The semiconductor device of claim 1, further comprising:
 a connecting path running through the semiconductor body and between the first side and the second metallization without crossing a pn-junction; and
 a silicon carbide contact layer arranged at the second metallization and in Ohmic connection with the second metallization.

8. The semiconductor device of claim 7, further comprising:
 a silicon carbide buffer layer in Ohmic connection with the silicon carbide contact layer, arranged between the silicon carbide contact layer and the first silicon carbide region, and having a lower doping concentration than the silicon carbide contact layer.

9. The semiconductor device of claim 8, further comprising:
 a silicon carbide drift layer in Ohmic connection with the silicon carbide contact layer, arranged on at least one of the silicon carbide contact layer and the silicon carbide buffer layer, extending at least close to the second silicon carbide region, and having a lower doping concentration than at least one of the silicon carbide contact layer, the first silicon carbide region and the silicon carbide buffer layer.

10. The semiconductor device of claim 9, wherein at least one of the first silicon carbide region has a higher doping concentration than the silicon carbide drift layer, the first silicon carbide region has a larger vertical extension than the second silicon carbide region, and the second silicon carbide region is embedded in the first silicon carbide region.

11. The semiconductor device of claim 1, wherein in a vertical direction perpendicular to the front side, the semiconductor device comprises a plurality of alternating first and second silicon carbide regions or a plurality of second silicon carbide regions embedded in the first silicon carbide region.

12. The semiconductor device of claim 1, further comprising an edge-termination structure arranged at the front side and surrounding the first silicon carbide region and the second silicon carbide region.

13. A bridge circuit comprising the semiconductor device of claim 1.

14. A semiconductor device, comprising:
 a semiconductor body having a first silicon carbide region and a second silicon carbide region which forms a pn-junction with the first silicon carbide region;
 a first metallization on a front side of the semiconductor body;
 a contact region that forms an Ohmic contact with the second silicon carbide region;
 a barrier-layer arranged between the first metallization and the contact region and that is in Ohmic connection with the first metallization and the contact region;
 a second metallization opposite the first metallization and in Ohmic connection with the first silicon carbide region;
 a connecting path running through the semiconductor body and between the first side and the second metallization without crossing a pn-junction; and
 a silicon carbide contact layer arranged at the second metallization and in Ohmic connection with the second metallization,
wherein the barrier-layer forms a Schottky junction with the first silicon carbide region,
wherein the barrier-layer comprises molybdenum nitride.

15. The semiconductor device of claim 14, further comprising:
 a silicon carbide buffer layer in Ohmic connection with the silicon carbide contact layer, arranged between the silicon carbide contact layer and the first silicon carbide region, and having a lower doping concentration than the silicon carbide contact layer.

16. The semiconductor device of claim 15, further comprising:
 a silicon carbide drift layer in Ohmic connection with the silicon carbide contact layer, arranged on at least one of the silicon carbide contact layer and the silicon carbide buffer layer, extending at least close to the second silicon carbide region, and having a lower doping concentration than at least one of the silicon carbide contact layer, the first silicon carbide region and the silicon carbide buffer layer.

17. The semiconductor device of claim 16, wherein at least one of the first silicon carbide region has a higher doping concentration than the silicon carbide drift layer, the first silicon carbide region has a larger vertical extension than the second silicon carbide region, and the second silicon carbide region is embedded in the first silicon carbide region.

18. A semiconductor device, comprising:
 a semiconductor body having a first silicon carbide region and a second silicon carbide region which forms a pn-junction with the first silicon carbide region;
 a first metallization on a front side of the semiconductor body;
 a contact region that forms an Ohmic contact with the second silicon carbide region;

a barrier-layer arranged between the first metallization and the contact region and that is in Ohmic connection with the first metallization and the contact region; and
an edge-termination structure arranged at the front side and surrounding the first silicon carbide region and the second silicon carbide region,
wherein the barrier-layer forms a Schottky junction with the first silicon carbide region,
wherein the barrier-layer comprises molybdenum nitride.

* * * * *